(12) United States Patent
Chu et al.

(10) Patent No.: US 12,218,184 B2
(45) Date of Patent: Feb. 4, 2025

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Jui-Lin Chu, Hsinchu (TW); Szu-Yu Wang, Hsinchu (TW); Ching I Li, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 247 days.

(21) Appl. No.: 17/824,924

(22) Filed: May 26, 2022

(65) Prior Publication Data

US 2023/0387189 A1    Nov. 30, 2023

(51) Int. Cl.
*H01G 4/10* (2006.01)
*H01L 21/768* (2006.01)
*H01L 23/522* (2006.01)
*H01L 49/02* (2006.01)

(52) U.S. Cl.
CPC .............. *H01L 28/75* (2013.01); *H01G 4/10* (2013.01); *H01L 21/76814* (2013.01); *H01L 23/5223* (2013.01)

(58) Field of Classification Search
CPC ......... H01L 28/40; H01L 28/56; H01L 28/57; H01L 28/75; H01L 23/5223; H01L 28/91; H01L 28/60; H01G 4/10; H01G 4/08; H01G 4/33; H01G 4/018; H01G 4/06
See application file for complete search history.

(56) References Cited

U.S. PATENT DOCUMENTS

2019/0355804 A1* 11/2019 Park .................... C23C 28/345
2020/0176552 A1*  6/2020 Chang ................. H01L 23/5329

* cited by examiner

*Primary Examiner* — Thanhha S Pham
(74) *Attorney, Agent, or Firm* — WPAT LAW; Anthony King

(57) ABSTRACT

A semiconductor structure includes a capacitor structure and a contact structure. The capacitor structure includes an electrode layer, a protective dielectric layer, and a capacitor dielectric layer. The protective dielectric layer covers a top surface of the electrode layer. The capacitor dielectric layer is on the protective oxide layer. The contact structure penetrates the protective oxide layer and electrically connects to the electrode layer.

20 Claims, 13 Drawing Sheets

SEMICONDUCTOR STRUCTURE AND METHOD FOR FORMING THE SAME

BACKGROUND

Integrated chips are formed on semiconductor dies that include millions or billions of transistor devices. The transistor devices are configured to act as switches and/or to produce power gains so as to enable logical functionality for an integrated chip (e.g., functionality to perform logic functions). Integrated chips often also include passive devices, such as capacitors, resistors, inductors, varactors, etc. Passive devices are widely used to control integrated chip characteristics (e.g., gain, time constants, etc.) and to provide an integrated chip with a wide range of different functionalities (e.g., incorporating both analog and digital circuitry on the same die).

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
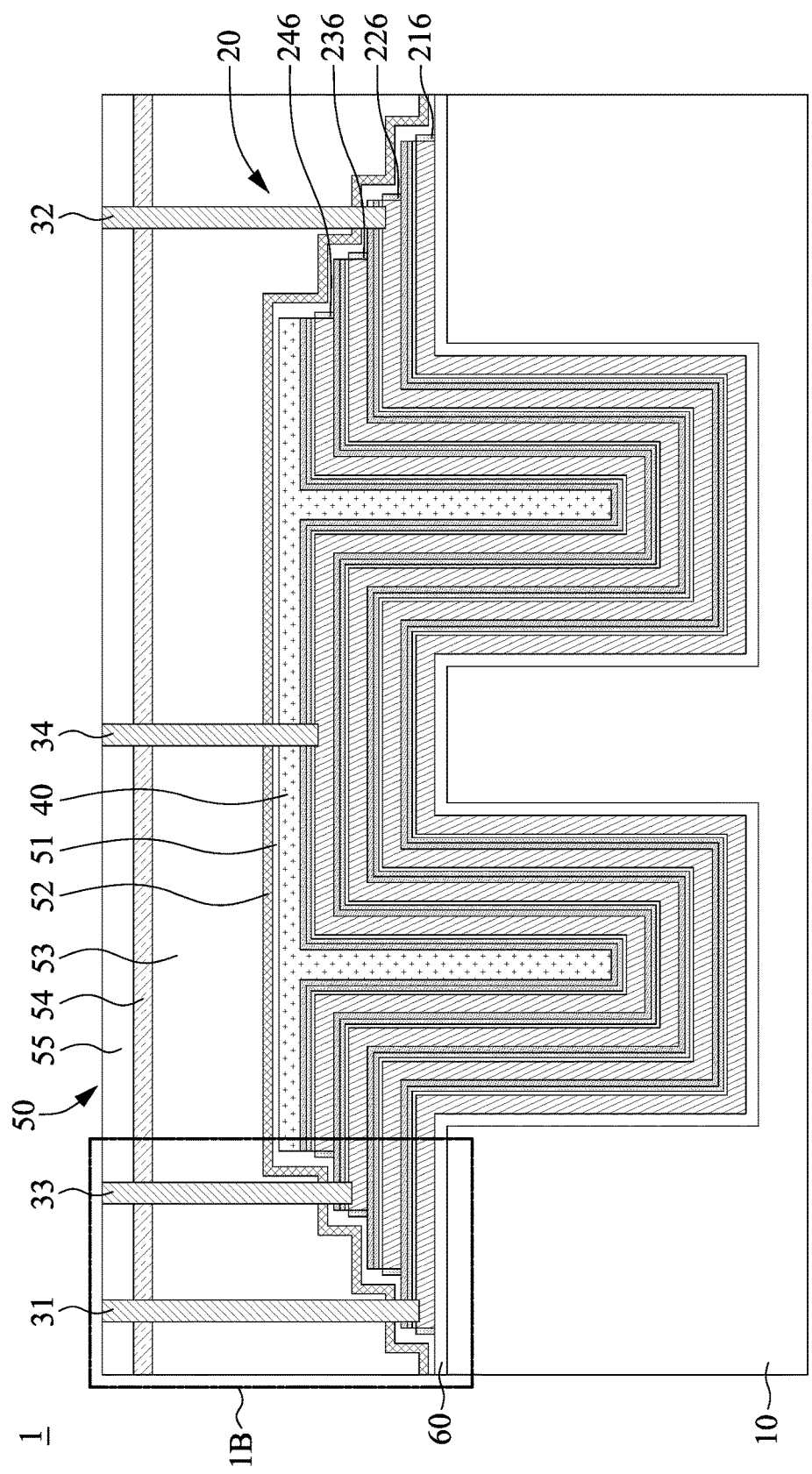
FIG. 1A is a cross-sectional view illustrating a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present disclosure discuss semiconductor structures including a protective dielectric layer between a capacitor dielectric layer and an electrode layer of a capacitor structure, the protective dielectric layer provides an increased dielectric thickness on the electrode layer, and thus it can provide an enlarged contact etching depth window. In addition, embodiments of the present disclosure further discuss methods of forming semiconductor structures including performing one or more surface treatment processes on one or more conductive layer of an MIM capacitor, the stress incurred by the conductive layers can be tuned by adjusting the conditions of the surface treatment processes, and thus the warpage of the semiconductor structure can be mitigated or prevented.

Figure 1B:
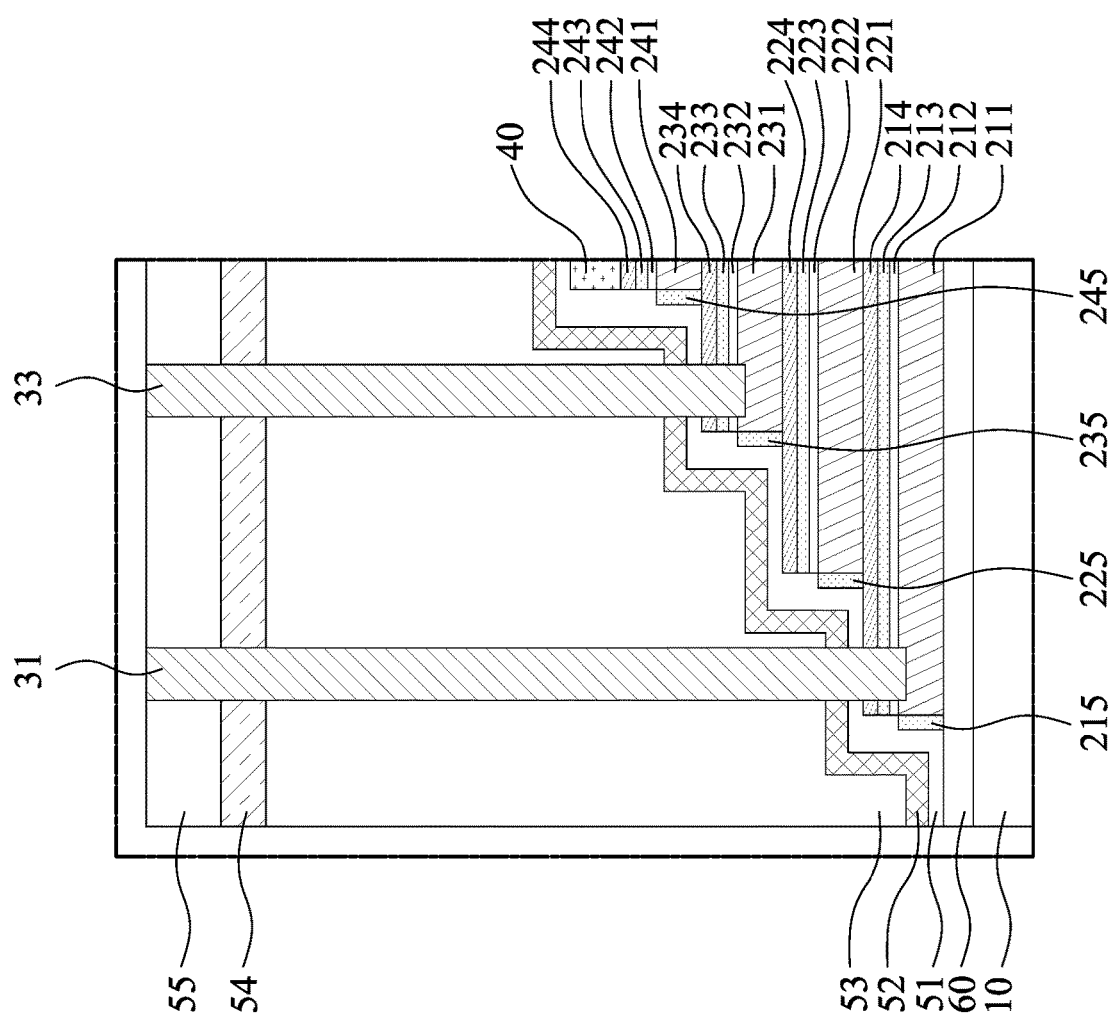
FIG. 1B is a cross-sectional view illustrating a portion of a semiconductor structure according to aspects of the present disclosure in one or more embodiments.

FIG. 1A is a cross-sectional view illustrating a semiconductor structure 1 according to aspects of the present disclosure in one or more embodiments. FIG. 1B is a cross-sectional view illustrating a portion of a semiconductor structure 1 according to aspects of the present disclosure in one or more embodiments. In some embodiments, FIG. 1B is a cross-sectional view illustrating a portion 1B of the semiconductor structure 1 in FIG. 1A.

Referring to FIGS. 1A and 1B, the semiconductor structure 1 includes a semiconductors substrate 10, a capacitor structure 20, contact structures 31, 32, 33 and 34, a filling dielectric material 40, a dielectric structure 50, and a liner 60.

In some embodiments, the semiconductor substrate 10 (also referred to as a die substrate) may include a bulk silicon substrate or a silicon-on-insulator (SOI) substrate. In other embodiments, the semiconductor substrate 10 may include one or more semiconductor materials that include group III, group IV, and/or group V elements. For example, the semiconductor substrate 10 may include germanium (Ge), silicon germanium (SiGe), silicon carbide (SiC), gallium arsenide (GaAs), or the like. The semiconductor substrate 10 may be a p-type semiconductor substrate (acceptor type) or an n-type semiconductor substrate (donor type). In some embodiments, a periphery region and a cell region can be defined over the semiconductor substrate 10. Various electrical components may be formed over the semiconductor substrate 10.

The capacitor structure 20 may be formed or disposed on the semiconductor substrate 10. In some embodiments, the capacitor structure 20 is formed or embedded in one or more trenches of the semiconductor substrate 10. The capacitor structure 20 may be referred to as a deep trench capacitor (DTC). In some embodiments, the capacitor structure 20 is or includes an MIM capacitor.

In some embodiments, the capacitor structure 20 includes a plurality of conductive layers 211, 221, 231 and 241 (also referred to as "electrode layers") and a plurality of dielectric layers 214, 224, 234 and 244 (also referred to as "capacitor dielectric layers"). In some embodiments, the dielectric layer 214, 224 and 234 are interposed between the conductive layers 211, 221, 231 and 241 to form an MIM capacitor. It should be noted that the numbers of the conductive layers (or the electrode layers) and the dielectric layers (or the capacitor dielectric layers) of the capacitor structure 20 may vary according to actual applications, and the present disclosure is not limited thereto.

In some embodiments, the capacitor structure 20 further includes a plurality of dielectric layers 213, 223, 233 and 243 (also referred to as "protective dielectric layers") each covering a top surface of each of the conductive layers 211, 221, 231 and 241. In some embodiments, the dielectric layers 213, 223, 233 and 243 may be or include buffer oxide layers. In some embodiments, the capacitor structure 20 further includes a plurality of dielectric layers 212, 222, 232 and 242 (also referred to as "interfacial dielectric layers") each disposed between a conductive layer and a protective dielectric layer. It should be noted that the numbers of the protective dielectric layers (or the buffer oxide layers) and the interfacial dielectric layers of the capacitor structure 20 may vary depending on the arrangements of the electrode layers and the capacitor dielectric layers according to actual applications, and the present disclosure is not limited thereto.

In some embodiments, the capacitor structure 20 further includes a plurality of dielectric layers 215, 216, 225, 226, 235, 236, 245 and 246 (also referred to as "dielectric sidewalls," "protective dielectric sidewalls," or "buffer oxide sidewalls") on lateral sides of the conductive layers 211, 221, 231 and 241. It should be noted that the numbers of the dielectric sidewalls (or the protective dielectric sidewalls) of the capacitor structure 20 may vary depending on the arrangements of the electrode layers according to actual applications, and the present disclosure is not limited thereto.

In some embodiments, the conductive layer 211 is over the semiconductor substrate 10, the conductive layer 221 is over the conductive layer 211, the conductive layer 231 is over the conductive layer 221, and the conductive layer 241 is over the conductive layer 231. The conductive layers 211, 221, 231 and 241 may include various conductive materials, such as copper (Cu), tungsten (W), cobalt (Co), aluminum (Al), tantalum (Ta), tantalum nitride (TaN), titanium (Ti), titanium nitride (TiN), an alloy thereof, a combination therefore, or the like, but the present disclosure is not limited thereto. In some embodiments, the conductive layers 211, 221, 231 and 241 are formed of or include TiN. In some embodiments, each of the conductive layers 211, 221, 231 and 241 may have a thickness from about 150 Å to about 250 Å, for example, about 200 Å. In some embodiments, portions of the conductive layers 211, 221, 231 and 241 are in the trenches of the semiconductor substrate 10.

In some embodiments, the dielectric layer (or the interfacial dielectric layer) 212 is on the conductive layer (or the electrode layer) 211, the dielectric layer 222 is on the conductive layer 221, the dielectric layer 232 is on the conductive layer 231, and the dielectric layer 242 is on the conductive layer 241. In some embodiments, each of the dielectric layers 212, 222, 232 and 242 may have a thickness of less than about 20 Å. In some embodiments, the thickness of each of the dielectric layers 212, 222, 232 and 242 may be less than about 15 Å. In some embodiments, the thickness of each of the dielectric layers 212, 222, 232 and 242 may be from about 10 Å to about 15 Å. In some embodiments, the dielectric layers 212, 222, 232 and 242 may include various dielectric materials, such as aluminum oxide ($Al_2O_3$), zirconium oxide ($ZrO_2$), tantalum nitride ($Ta_2O_5$), titanium oxide ($TiO_2$ or $TiO_x$), titanium oxynitride ($TiO_xN_y$), silicon oxide ($SiO_2$), silicon nitride ($SiN_4$), silicon oxynitride ($SiO_xN_y$), a combination therefore, or the like, but the present disclosure is not limited thereto. In some embodiments, the dielectric layers 212, 222, 232 and 242 are formed of or include titanium oxynitride ($TiO_xN_y$). In some embodiments, portions of the dielectric layers 212, 222, 232 and 242 are in the trenches of the semiconductor substrate 10.

In some embodiments, the dielectric layer (or the protective dielectric layer) 213 is over or covering a top surface of the conductive layer (or the electrode layer) 211, the dielectric layer 223 is over or covering a top surface of the conductive layer 221, the dielectric layer 233 is over or covering a top surface of the conductive layer 231, and the dielectric layer 243 is over or covering a top surface of the conductive layer 241. In some embodiments, the dielectric layer 212 is between the conductive layer 211 and the dielectric layer 213, the dielectric layer 222 is between the conductive layer 221 and the dielectric layer 223, the dielectric layer 232 is between the conductive layer 231 and the dielectric layer 233, and the dielectric layer 242 is between the conductive layer 241 and the dielectric layer 243. In some embodiments, portions of the dielectric layers 213, 223, 233 and 243 are in the trenches of the semiconductor substrate 10.

In some embodiments, each of the dielectric layers 213, 223, 233 and 243 may have a thickness greater than the thickness of each of the dielectric layers 212, 222, 232 and 242. In some embodiments, the thickness of each of the dielectric layers 213, 223, 233 and 243 may be greater than about 20 Å. In some embodiments, the thickness of each of the dielectric layers 213, 223, 233 and 243 may be from about 20 Å to about 50 Å. In some embodiments, the thickness of each of the dielectric layers 213, 223, 233 and 243 may be from about 30 Å to about 40 Å. In some embodiments, the dielectric layers 213, 223, 233 and 243 may include various dielectric materials, such as aluminum oxide ($Al_2O_3$), zirconium oxide ($ZrO_2$), tantalum nitride ($Ta_2O_5$), titanium oxide ($TiO_2$ or $TiO_x$), titanium oxynitride ($TiO_xN_y$), silicon oxide ($SiO_2$), silicon nitride ($Si_3N_4$), silicon oxynitride ($SiO_xN_y$), a combination therefore, or the like, but the present disclosure is not limited thereto. In some embodiments, the dielectric layers 213, 223, 233 and 243 are formed of or include titanium oxide ($TiO_2$ or TiO). In some embodiments, the material(s) of the dielectric layers 212, 222, 232 and 242 are different from the material(s) of the dielectric layers 213, 223, 233 and 243.

In some embodiments, the dielectric layer (or the capacitor dielectric layer) 214 is on the dielectric layer (or the protective dielectric layer) 213, the dielectric layer 224 is over the dielectric layer 223, the dielectric layer 234 is over the dielectric layer 233, and the dielectric layer 244 is over the dielectric layer 243. In some embodiments, the dielectric layer (or the protective dielectric layer) 213 is between the conductive layer (or the electrode layer) 211 and the dielectric layer (or the capacitor dielectric layer) 214, the dielectric layer 223 is between the conductive layer 221 and the dielectric layer 224, the dielectric layer 233 is between the conductive layer 231 and the dielectric layer 234, and the dielectric layer 243 is between the conductive layer 241 and the dielectric layer 244. In some embodiments, the dielectric layer (or the interfacial layer) 212 is between the conductive layer (or the electrode layer) 211 and the dielectric layer (or the protective dielectric layer) 213, the dielectric layer 222 is between the conductive layer 221 and the dielectric layer 223, the dielectric layer 232 is between the conductive layer 231 and the dielectric layer 233, and the dielectric layer 242 is between the conductive layer 241 and the dielectric layer 243.

In some embodiments, a thickness of each of the dielectric layers (or the capacitor dielectric layers) 214, 224, 234 and 244 is greater than the thickness of each of the dielectric layers (or the interfacial dielectric layers) 212, 222, 232 and 242. In some embodiments, the thickness of each of the dielectric layers (or the capacitor dielectric layers) 214, 224, 234 and 244 is greater than about 20 Å. In some embodiments, the thickness of each of the dielectric layers 214, 224, 234 and 244 may be from about 25 Å to about 80 Å. In some embodiments, the thickness of each of the dielectric layers 214, 224, 234 and 244 may be from about 40 Å to about 70 Å. In some embodiments, a ratio of the thickness of each of the dielectric layers (or the protective dielectric layers) 213, 223, 233 and 243 to the thickness of each of the dielectric layers 214, 224, 234 and 244 is greater than about 0.25, about 0.4, about 0.6, or about 0.8. In some embodiments, a ratio of the thickness of each of the dielectric layers (or the protective dielectric layers) 213, 223, 233 and 243 to the thickness of each of the dielectric layers 214, 224, 234 and 244 is from about 0.25 to about 1.2, from about 0.4 to about 1.1, or from about 0.6 to about 1. In some embodiments, a ratio of a sum of the thickness of each of the dielectric layers (or the protective dielectric layers) 213, 223, 233 and 243 and the thickness of each of the dielectric layers (or the interfacial dielectric layers) 212, 222, 232 and 242 to the thickness of each of the dielectric layers 214, 224, 234 and 244 is greater than about 0.3, about 0.4, about 0.6, or about 0.8. In some embodiments, a ratio of a sum of the thickness of each of the dielectric layers (or the protective dielectric layers) 213, 223, 233 and 243 and the thickness of each of the dielectric layers (or the interfacial dielectric layers) 212, 222, 232 and 242 to the thickness of each of the dielectric layers 214, 224, 234 and 244 is from about 0.3 to about 1.4, from about 0.4 to about 1.2, or from about 0.6 to about 1.

In some embodiments, the dielectric layers 214, 224, 234 and 244 may include various dielectric materials, for example, one or more high-k dielectric materials. The dielectric layers 214, 224, 234 and 244 may include such as aluminum oxide ($Al_2O_3$), zirconium oxide ($ZrO_2$), silicon nitride ($Si_3N_4$), tantalum nitride ($Ta_2O_5$), titanium oxide ($TiO_2$), strontium titanate ($SrTiO_3$), yttrium oxide ($Y_2O_3$), lanthanum oxide ($La_2O_3$), hafnium oxide ($HfO_2$), hafnium oxynitride ($HfO_xN_y$), a combination therefore, a multi-layer structure of the combination thereof, or the like, but the present disclosure is not limited thereto. In some embodiments, each of the dielectric layers 214, 224, 234 and 244 is formed of or include a three-layered structure including an aluminum oxide layer interposed between two zirconium oxide layers. In some embodiments, the material(s) of the dielectric layers 214, 224, 234 and 244 are different from the material(s) of the dielectric layers 212, 222, 232 and 242 and the material(s) of the dielectric layers 213, 223, 233 and 243.

In some embodiments, each of the conductive layers (or the electrode layers) 211, 221, 231 and 241 and each of the corresponding dielectric layers (or the protective dielectric layers) 213, 223, 233 and 243 include a same metal element. In some embodiments, the conductive layer 211 and the dielectric layers 212 and 213 formed thereon include a same metal element. In some embodiments, the conductive layer 221 and the dielectric layers 222 and 223 formed thereon include a same metal element. In some embodiments, the conductive layer 231 and the dielectric layers 232 and 233 formed thereon include a same metal element. In some embodiments, the conductive layer 241 and the dielectric layers 242 and 243 formed thereon include a same metal element. The aforesaid same metal element may be titanium. For example, one or each of the conductive layers 211, 221, 231 and 241 may include TiN, the corresponding dielectric layers (or the interfacial dielectric layers) 212, 222, 232 and/or 242 formed thereon may include $TiO_xN_y$, and the corresponding dielectric layers (or the protective dielectric layers) 213, 223, 233 and/or 243 formed thereon may include $TiO_x$.

In some embodiments, the dielectric layers (also referred to as the dielectric sidewalls, the protective dielectric sidewalls, or the buffer oxide sidewalls) 215, 216, 225, 226, 235, 236, 245 and 246 cover one or more lateral surfaces of the conductive layers (or the electrode layers) 211, 221, 231 and 241. In some embodiments, the dielectric layers 215 and 216 are formed on or cover the lateral surfaces of the conductive layer 211. In some embodiments, the dielectric layers 225 and 226 cover the lateral surfaces of the conductive layer 221. In some embodiments, the dielectric layers 225 and 226 are on the lateral surfaces of the conductive layer 221 and the top surface of the conductive layer 211. In some embodiments, the dielectric layers 235 and 236 cover the lateral surfaces of the conductive layer 231. In some embodiments, the dielectric layers 235 and 236 are on the lateral surfaces of the conductive layer 231 and the top surface of the conductive layer 221. In some embodiments, the dielectric layers 245 and 246 cover the lateral surfaces of the conductive layer 241. In some embodiments, the dielectric layers 245 and 246 are on the lateral surfaces of the conductive layer 241 and the top surface of the conductive layer 231.

In some embodiments, each of the dielectric layers 215, 216, 225, 226, 235, 236, 245 and 246 may have a thickness greater than the thickness of each of the dielectric layers 212, 222, 232 and 242. In some embodiments, the thickness of each of the dielectric layers 215, 216, 225, 226, 235, 236, 245 and 246 may be greater than about 20 Å. In some embodiments, the thickness of each of the dielectric layers 215, 216, 225, 226, 235, 236, 245 and 246 may be from about 20 Å to about 50 Å. In some embodiments, the thickness of each of the dielectric layers 215, 216, 225, 226, 235, 236, 245 and 246 may be from about 30 Å to about 40 Å. In some embodiments, the dielectric layers 215, 216, 225, 226, 235, 236, 245 and 246 may include various dielectric materials, such as aluminum oxide ($Al_2O_3$), zirconium oxide ($ZrO_2$), tantalum nitride ($Ta_2Os$), titanium oxide ($TiO_2$ or $TiO_x$), titanium oxynitride ($TiO_xN_y$), silicon oxide ($SiO_2$), silicon nitride ($Si_3N_4$), silicon oxynitride ($SiO_xN_y$), a combination therefore, or the like, but the present disclosure is not limited thereto. In some embodiments, the dielectric layers 215, 216, 225, 226, 235, 236, 245 and 246 are formed of or include titanium oxide. In some embodiments, the dielectric layers 215, 216, 225, 226, 235, 236, 245 and 246 and the dielectric layers 213, 223, 233 and 243 may include substantially the same material(s).

In some embodiments, the contact structure 31 penetrates the dielectric layers 212, 213 and 214 to contact the conductive layer 211. In some embodiments, the contact structure 31 penetrates the capacitor dielectric layer (i.e., the dielectric layer 214), the protective dielectric layer (i.e., the dielectric layer 213), and the interfacial dielectric layer (i.e., the dielectric layer 212) to electrically connect to the electrode layer (i.e., the conductive layer 211). In some embodiments, the contact structure 32 penetrates the dielectric layers 222, 223 and 224 to contact the conductive layer 221. In some embodiments, the contact structure 32 penetrates the capacitor dielectric layer (i.e., the dielectric layer 224), the protective dielectric layer (i.e., the dielectric layer 223), and the interfacial dielectric layer (i.e., the dielectric layer 222) to electrically connect to the electrode layer (i.e., the conductive layer 221). In some embodiments, the contact structure 33 penetrates the dielectric layers 232, 233 and 234 to contact the conductive layer 231. In some embodiments, the contact structure 33 penetrates the capacitor dielectric layer (i.e., the dielectric layer 234), the protective dielectric layer (i.e., the dielectric layer 233), and the interfacial dielectric layer (i.e., the dielectric layer 232) to electrically connect to the electrode layer (i.e., the conductive layer 231). In some embodiments, the contact structure 34 penetrates the dielectric layers 242, 243 and 244 to contact the conductive layer 241. In some embodiments, the contact structure 34 penetrates the capacitor dielectric layer (i.e., the dielectric layer 244), the protective dielectric layer (i.e., the dielectric layer 243), and the interfacial dielectric layer (i.e., the dielectric layer 242) to electrically connect to the electrode layer (i.e., the conductive layer 241).

In some embodiments, the conductive structure 31 extends into a portion of the conductive layer 211. In some embodiments, the conductive structure 32 extends into a portion of the conductive layer 221. In some embodiments, the conductive structure 33 extends into a portion of the conductive layer 231. In some embodiments, the conductive structure 34 extends into a portion of the conductive layer 241. The contact structures 31, 32, 33 and 34 may include various conductive materials, such as copper (Cu), tungsten (W), cobalt (Co), aluminum (Al), tantalum (Ta), tantalum nitride (TaN), titanium (Ti), titanium nitride (TiN), an alloy thereof, a combination therefore, or the like, but the present disclosure is not limited thereto. In some embodiments, the contact structures 31, 32, 33 and 34 are formed of or include Cu.

In some embodiments, the filling dielectric material 40 is filled in one or more gaps or voids defined by one or more portions of the capacitor structure 20 within the one or more trenches of the semiconductor substrate 10. In some embodiments, the filling dielectric material 40 directly contacts the dielectric layer 244. In some embodiments, the filling dielectric material 40 may include silicon oxide.

In some embodiments, the dielectric structure 50 covers the capacitor structure 20 and the contact structures 31, 32, 33 and 34. In some embodiments, the dielectric structure 50 contacts the dielectric layers (or the dielectric sidewalls) 215, 216, 225, 226, 235, 236, 245 and 246. In some embodiments, the dielectric structure 50 may include multilayers made of multiple dielectric materials. In some embodiments, the dielectric structure 50 includes dielectric layers 51, 52, 53, 54 and 55. In some embodiments, the dielectric layer 52 may be a contact etch stop layer (CESL). The CESL may include silicon nitride, silicon oxynitride, and/or other applicable materials. In some embodiments, the dielectric layers 51, 53, 54 and 55 may form an inter-layer dielectric (ILD) structure. The ILD structure may include multilayers made of multiple dielectric materials, such as silicon oxide, silicon nitride, silicon oxynitride, tetraethoxysilane (TEOS), phosphosilicate glass (PSG), borophosphosilicate glass (BPSG), a low-k dielectric material, and/or other applicable dielectric materials. Examples of low-k dielectric material includes, but are not limited to, fluorinated silica glass (FSG), carbon-doped silicon oxide, amorphous fluorinated carbon, parylene, bis-benzocyclobutenes (BCB), and polyimide. In some embodiments, the dielectric layers 51, 53 and 55 include silicon oxide, and the dielectric layer 52 includes silicon oxynitride.

In some embodiments, the liner 60 is conformally formed on the top surface and in the trenches of the semiconductor substrate 10. In some embodiments, the liner 60 includes silicon oxide or the like.

According to some embodiments of the present disclosure, a protective dielectric layer is between a capacitor dielectric layer and an electrode layer of a capacitor structure, the protective dielectric layer provides an increased dielectric thickness on the electrode layer, and thus it can provide an enlarged contact etching depth window. Therefore, when an etching process is performed over an electrode layer to form a through hole in which a contact structure is formed subsequently, the enlarged contact etching depth window of the increased dielectric thickness prevents the etching process (e.g., an over-etching process) from penetrating through the electrode layer to another electrode layer underneath, and thus undesired short circuit between adjacent electrode layers can be prevented.

In addition, according to some embodiments of the present disclosure, with a buffer oxide layer formed between a capacitor dielectric layer and an electrode layer of a capacitor structure, the stress incurred by the electrode layer can be compensated, and thus the warpage of the semiconductor structure 1 can be mitigated or prevented. For example, when the capacitor structure 20 is an MIM capacitor including a plurality of electrode layers each having a relatively large area and stacked on each other, the stress incurred by the electrode layers may result in high warpage, and the buffer oxide layers formed between the electrode layers and the capacitor dielectric layers can modulate the stress and thus reduce the warpage.

Moreover, according to some embodiments of the present disclosure, the dielectric sidewalls on lateral surfaces of the electrode layers may be formed by oxidation reaction on the lateral surfaces of the electrode layers during manufacturing. For example, contaminations or residues from previous processes (e.g., etching processes) may be consumed and removed by the oxidation reaction and form the dielectric sidewalls. Therefore, contaminations can be mitigated or prevented, and the yield can be improved.

FIGS. 2A to 2J are cross-sectional views illustrating a semiconductor structure 1 at various fabrication stages according to aspects of the present disclosure in one or more embodiments.

Figure 2A:
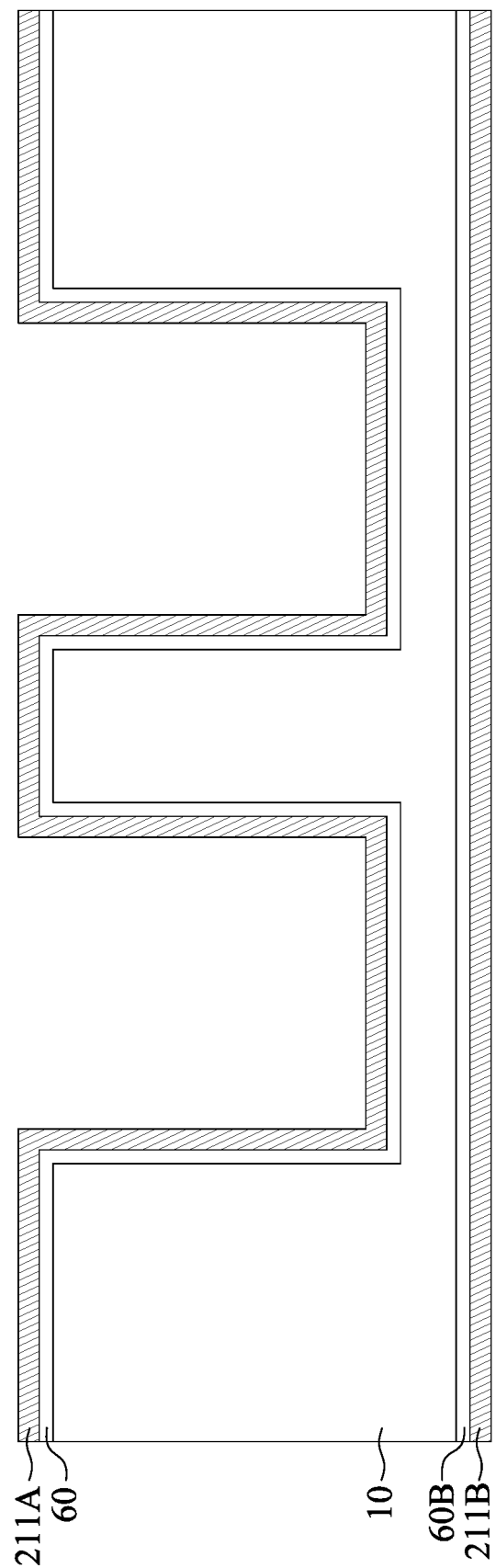
FIGS. 2A to 2J are cross-sectional views illustrating a semiconductor structure at various fabrication stages according to aspects of the present disclosure in one or more embodiments.

Referring to FIG. 2A, a liner 60 and a conductive layer 211A may be formed over a semiconductor substrate 10. In some embodiments, the liner 60 may be formed by spin coating, deposition, plasma enhanced deposition, or the like. In some embodiments, the conductive layer 211A may be formed by deposition, e.g., an ALD process. In some embodiments, while the semiconductor substrate 10 is fully exposed to the reaction chamber, a liner 60B may be formed on a bottom surface of the semiconductor substrate 10 while the liner 60 is formed on a top surface and in trenches of the semiconductor substrate 10. In some embodiments, a conductive layer 211B may be formed on the liner 60B while the conductive layer 211A is formed on the liner 60. In some embodiments, the liners 60 and 60A are formed from the same precursor in the same process, and the conductive layers 211A and 211B are formed from the same precursor in the same process.

In some embodiments, the conductive layers 211A and 221B are formed of TiN. In some embodiments, the precursor for forming the conductive layers 211A and 211B by ALD includes $TiCl_4$. In some embodiments, the deposition temperature is from about 350° C. to about 450° C., for example, about 400° C.

Figure 2B:
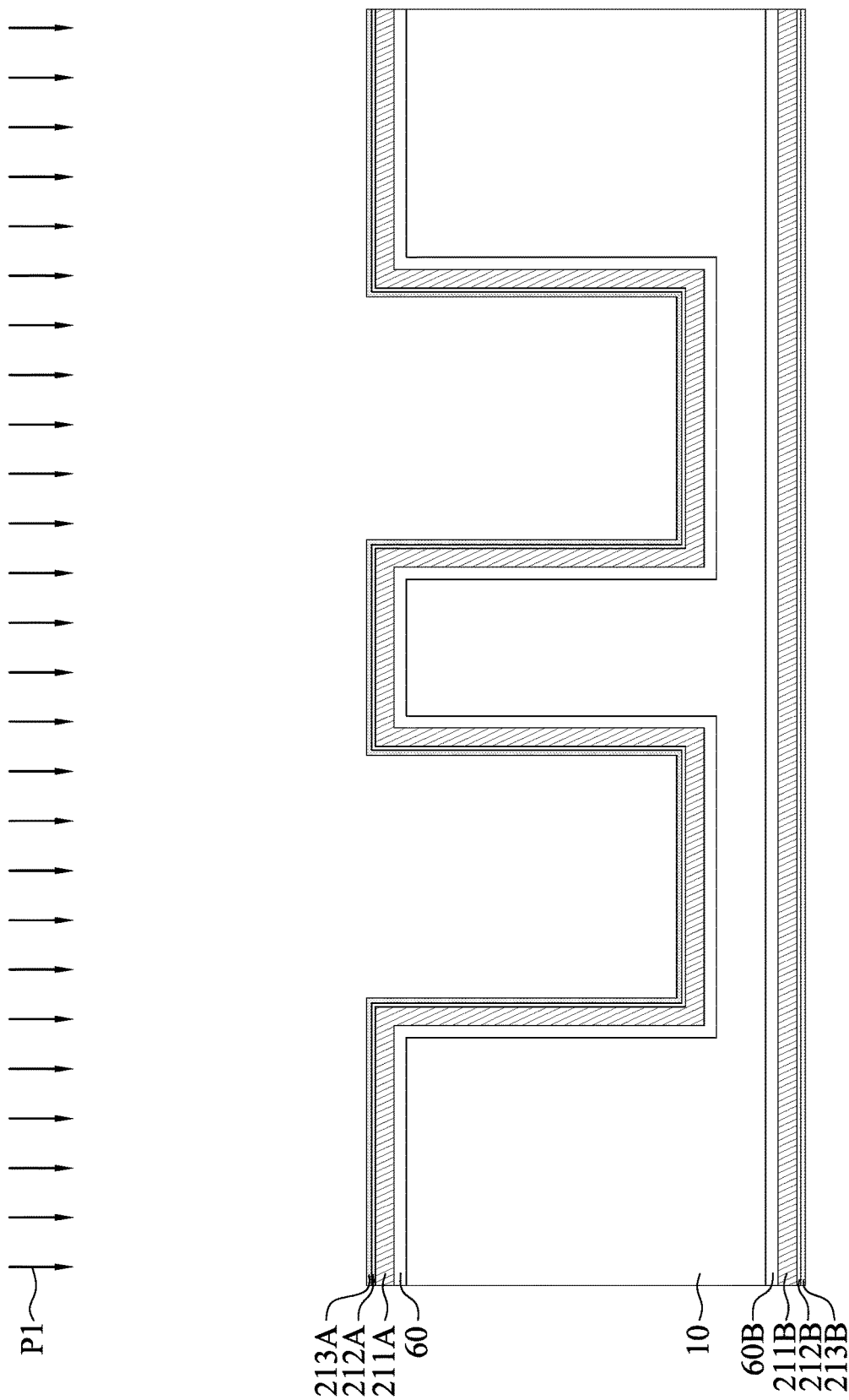

Referring to FIG. 2B, a surface treatment process P1 may be performed on a top surface of the conductive layer 211A to form a dielectric layer 213A on the conductive layer 211A. In some embodiments, the dielectric layer 213A may serve as a protective layer or a buffer layer in subsequent etching processes. In some embodiments, the surface treatment process P1 may be a surface oxidation process, and the as-formed dielectric layer 213A may be an oxide layer. In some embodiments, the conductive layer 211A includes a metal element, and the dielectric layer 213A includes an oxide of the metal element. In some embodiments, the dielectric layer (or the oxide layer) 213A is formed from oxidizing the metal element of the conductive layer 211A. For example, the conductive layer 211A includes titanium nitride (TiN), and the dielectric layer 213A includes titanium oxide ($TiO_x$). In some embodiments, an interfacial dielectric layer 212A may be formed between the conductive layer 211A and the dielectric layer 213A. In some embodiments, the conductive layer 211A includes a metal element, and the interfacial dielectric layer 212A includes an oxide of the metal element. In some embodiments, the interfacial dielectric layer 212A includes titanium oxynitride ($TiO_xN_y$).

Still referring to FIG. 2B, similar to the aforementioned condition where the liner 60B and the conductive layer 211B are formed on the bottom surface of the semiconductor substrate 10, a dielectric layer 213B and an interfacial dielectric layer 212B may be formed on the conductive layer 211B by the surface treatment process P1. In some embodiments, the conductive layer 211B includes titanium nitride (TiN), the interfacial dielectric layer 212B includes titanium oxynitride ($TiO_xN_y$), and the dielectric layer 213B includes titanium oxide ($TiO_x$).

Still referring to FIG. 2B, in some embodiments, the surface treatment process P1 includes applying an oxygen-containing gas on the top surface of the conductive layer 211A and performing a thermal process on the top surface of the conductive layer 211A. In some embodiments, the thermal process is performed under a temperature from about 200° C. to about 400° C. or from about 250° C. to about 350° C. The temperature range of the thermal process of the surface treatment process P1 is critical in accordance with some embodiments of the present disclosure. When the temperature exceeds 400° C., the risk of undesired crystallization of the dielectric material may increase; when the temperature is lower than 200° C., is may be insufficient to produce the desired protective dielectric layer. In some embodiments, the thermal process is performed for about 3 minutes to about 30 minutes, about 5 minutes to about 20 minutes, or about 10 minutes to about 15 minutes. In some embodiments, the oxygen-containing gas may include oxygen ($O_2$), nitrous oxide ($N_2O$), ozone ($O_3$), or a combination thereof.

Figure 2C:
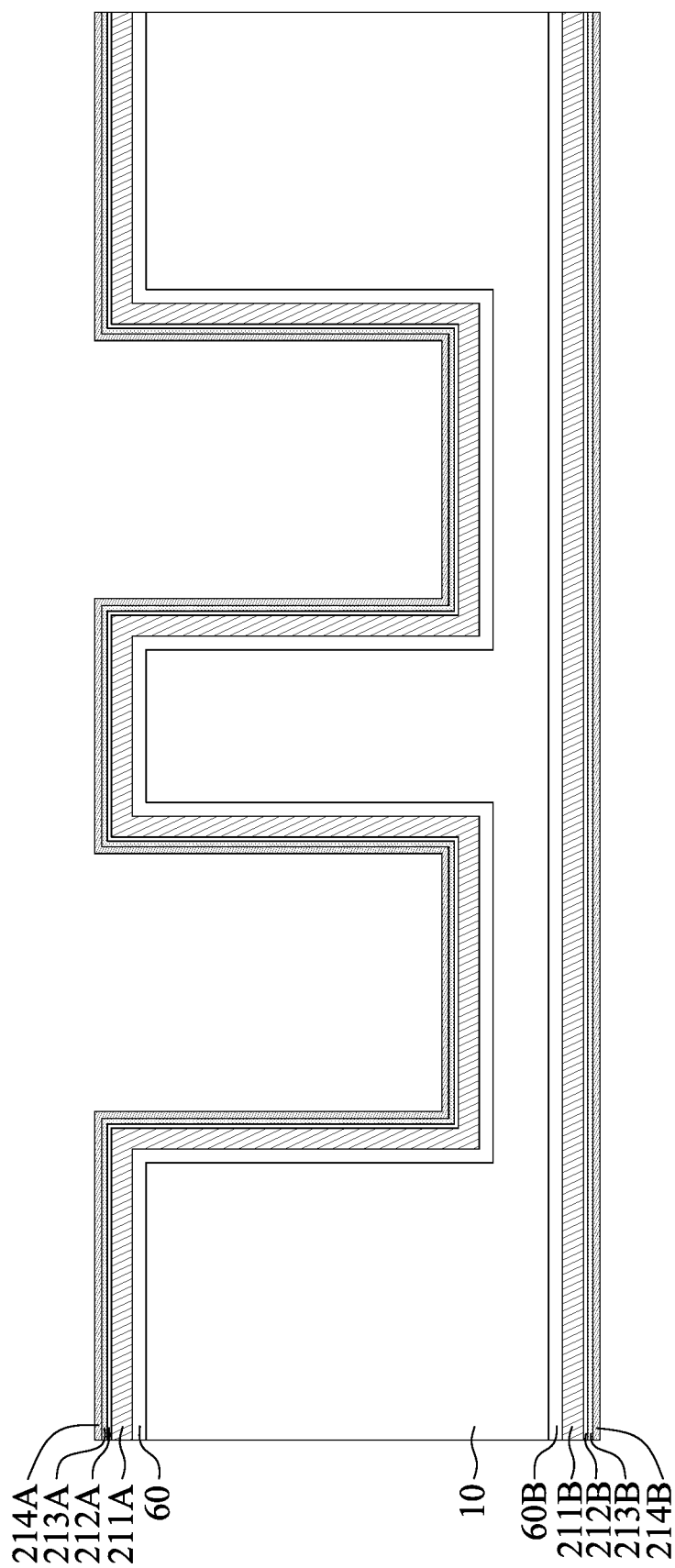

Referring to FIG. 2C, a dielectric layer 214A may be formed on the dielectric layer 213A. In some embodiments, the dielectric layer 214A may be formed by deposition, e.g., an ALD process. In some embodiments, a dielectric layer 214B is formed on the dielectric layer 213B.

Figure 2D:
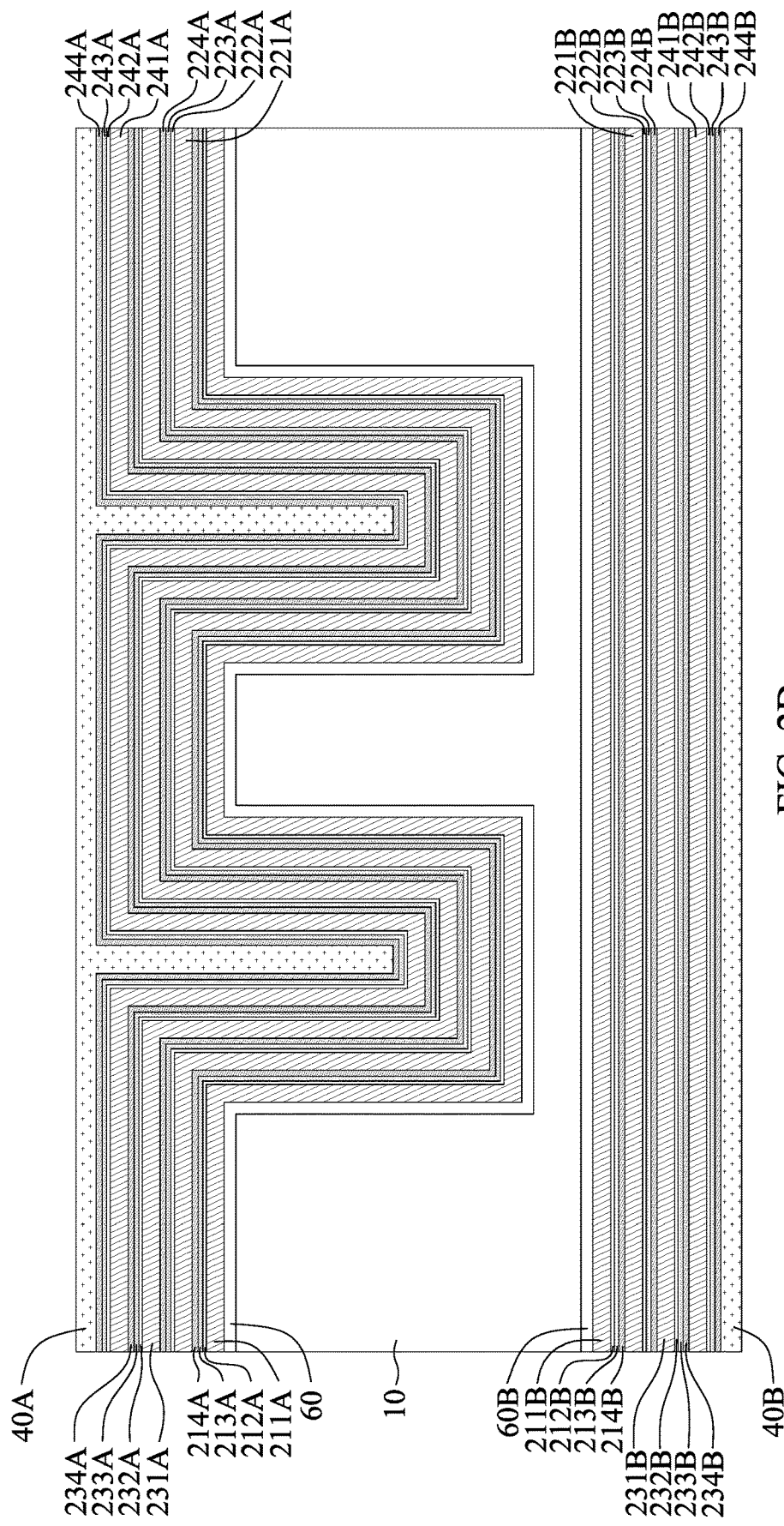

Referring to FIG. 2D, operations similar to those illustrated in FIGS. 2A-2C may be performed to form conductive layers 221A, 231A, 241A, 221B, 231B and 241B, dielectric layers 223A, 233A, 243A, 223B, 233B and 243B, interfacial dielectric layers 222A, 232A, 242A, 222B, 232B and 242B, and dielectric layers 224A, 234A, 244A, 224B, 234B and 244B. In some embodiments, filling dielectric materials 40A and 40B are formed on the dielectric layers 244A and 244B, and the filling dielectric material 40A is filled in the gaps or voids defined by the dielectric layer 244A. The filling dielectric materials 40A and 40B may be formed by deposition, e.g., an ALD process.

Figure 2E:
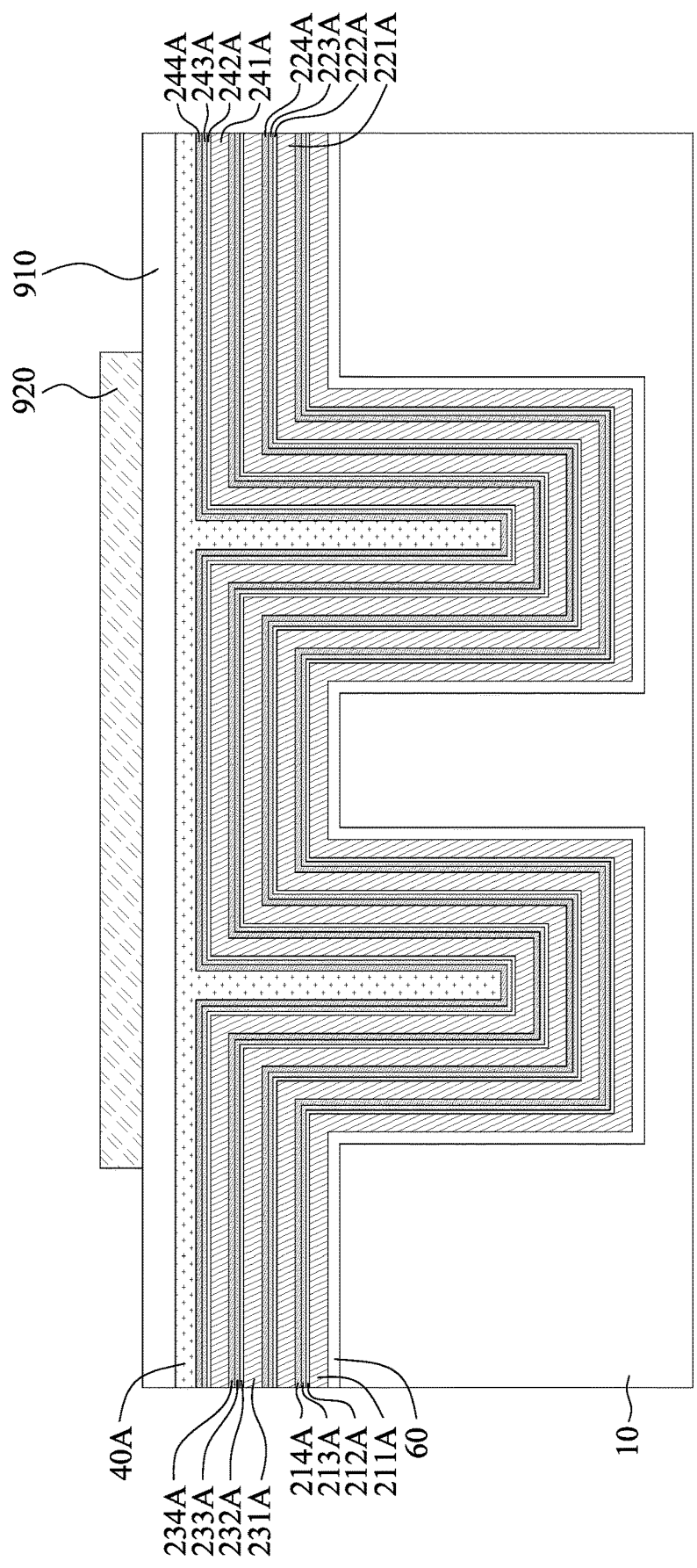

Referring to FIG. 2E, a hard mask 910 may be formed or disposed on the dielectric layer 244A, and a patterned photoresist 920 may be formed or disposed on the hard mask 910.

Figure 2F:
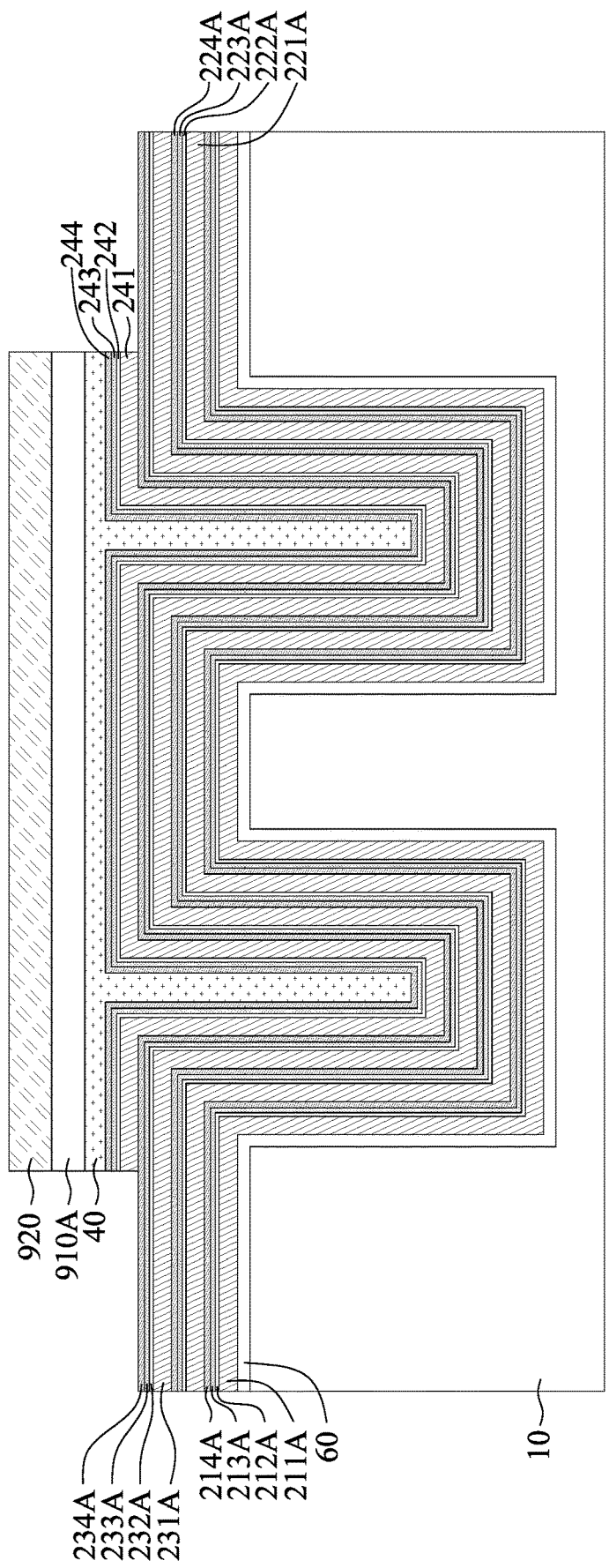

Referring to FIG. 2F, the hard mask 910 may be patterned according to the patterned photoresist 920 to form a patterned hard mask 910A, and the filling dielectric material 40A, the interfacial dielectric layer 242A, the dielectric layers 243A and 244A, and the conductive layer 241A are patterned according to the patterned hard mask 910A to form a conductive layer 241 and dielectric layers 242, 243 and 244. In some embodiments, the filling dielectric material 40A, the interfacial dielectric layer 242A, the dielectric layers 243A and 244A, and the conductive layer 241A are patterned by performing one or more etching processes. In some embodiments, the etching process for patterning the high-k dielectric material may include applying a halogen-containing etchant (e.g., $C_4F_6$) for about 10 seconds. In some embodiments, the etching process for patterning the conductive layer (e.g., TiN) may include applying a halogen-containing etchant (e.g., $C_4F_6$) for about 115 seconds. In some embodiments, a portion of the dielectric layer 234A is exposed from the conductive layer 241 and the dielectric layers 242, 243 and 244. In some embodiments, a backside removal process may be performed to remove the conductive layers 221B, 231B and 241B, the dielectric layers 223B, 233B and 243B, the interfacial dielectric layers 222B, 232B and 242B, and the dielectric layers 224B, 234B and 244B from the bottom surface of the semiconductor substrate 10. In some embodiments, the backside removal process is performed by etching.

Figure 2G:
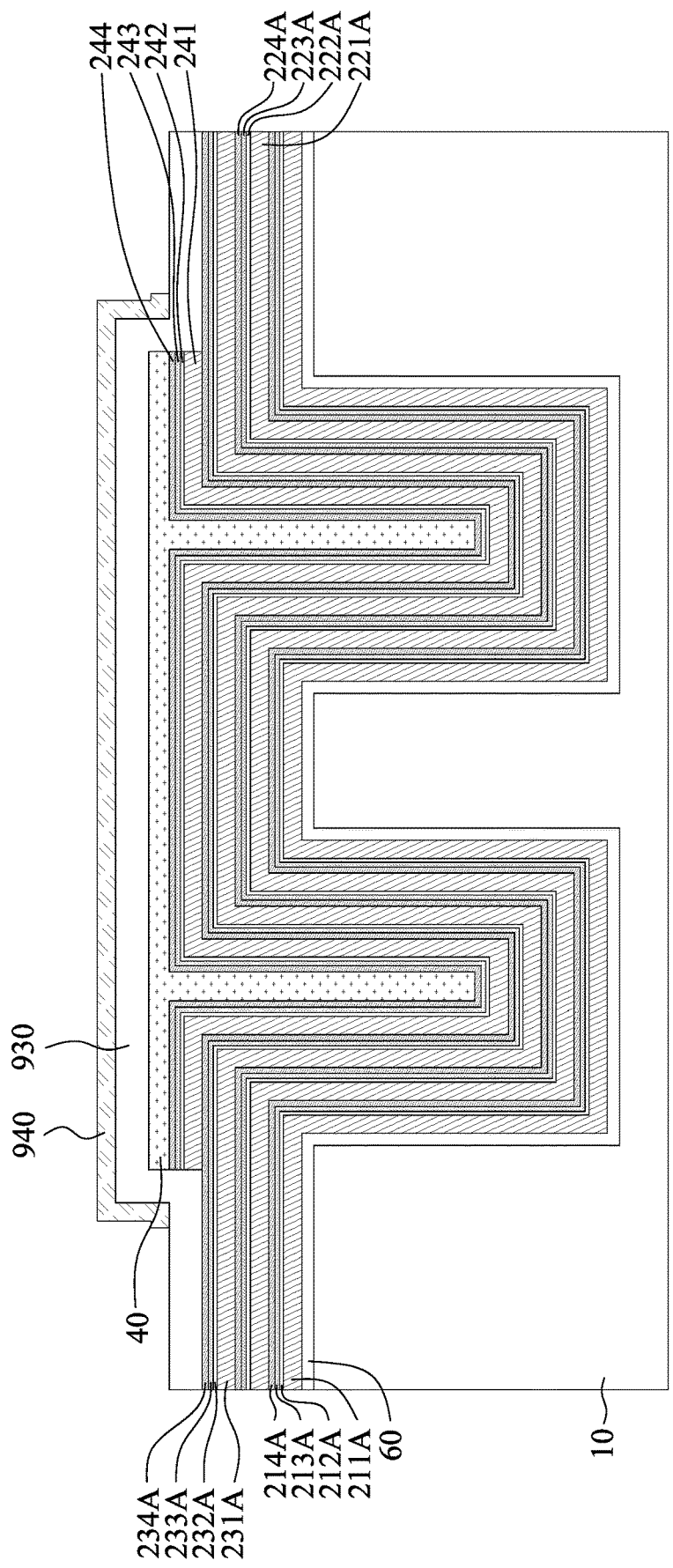

Referring to FIG. 2G, a hard mask 930 may be formed or disposed on the dielectric layer 234A, and a patterned photoresist 940 may be formed or disposed on the hard mask 930. In some embodiments, the patterned photoresist 940 is formed on the conductive layer 241, the dielectric layers 242, 243 and 244, and a portion of the dielectric layer 234A.

Figure 2H:
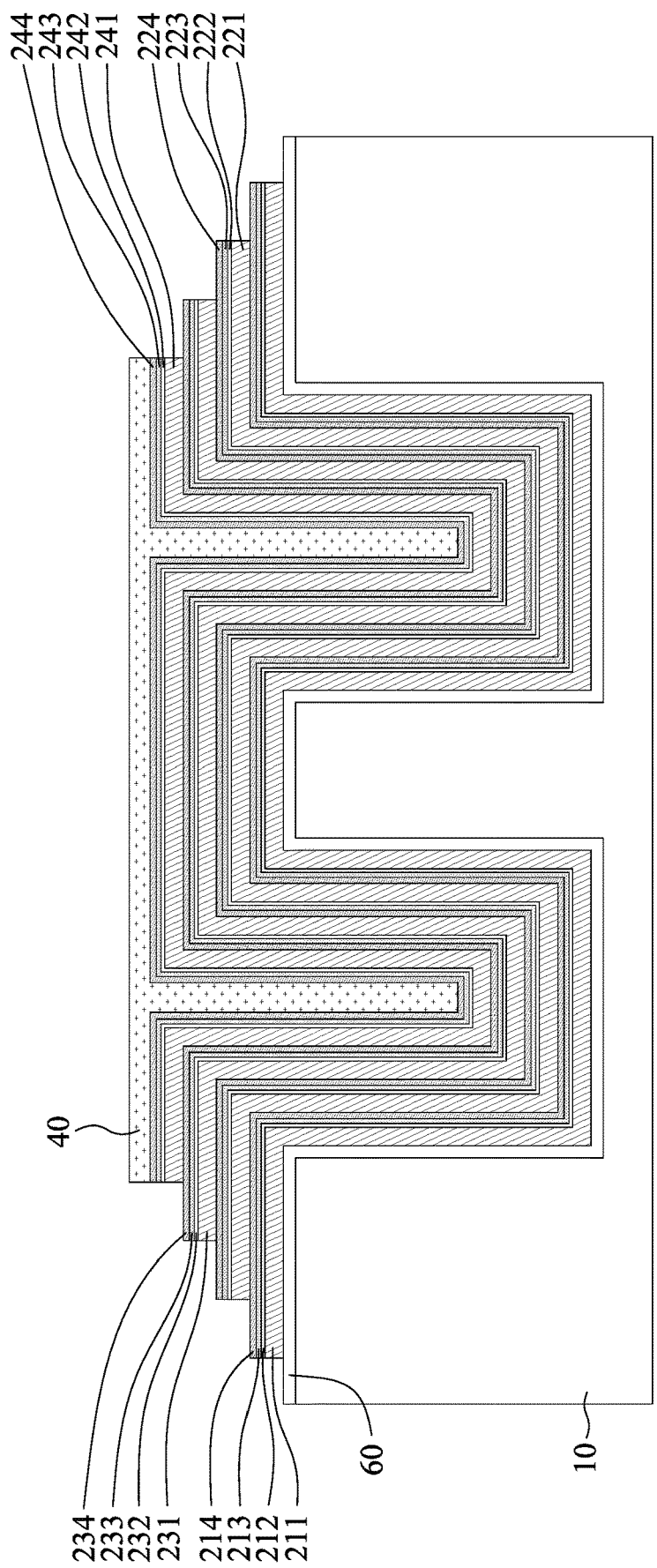

Referring to FIG. 2H, the hard mask 930 may be patterned according to the patterned photoresist 940 to form a patterned hard mask, and the interfacial dielectric layer 232A, the dielectric layers 233A and 234A, and the conductive layer 231A are patterned according to the patterned photoresist 940 and the patterned hard mask to form a conductive layer 231 and dielectric layers 232, 233 and 234. In some embodiments, the interfacial dielectric layer 232A, the dielectric layers 233A and 234A, and the conductive layer 231A are patterned by performing an etching process. In some embodiments, operations similar to those illustrated in FIGS. 2E-2G may be performed to form conductive layers 211 and 221 and dielectric layers 212, 213, 214, 222, 223 and 224.

Figure 2I:
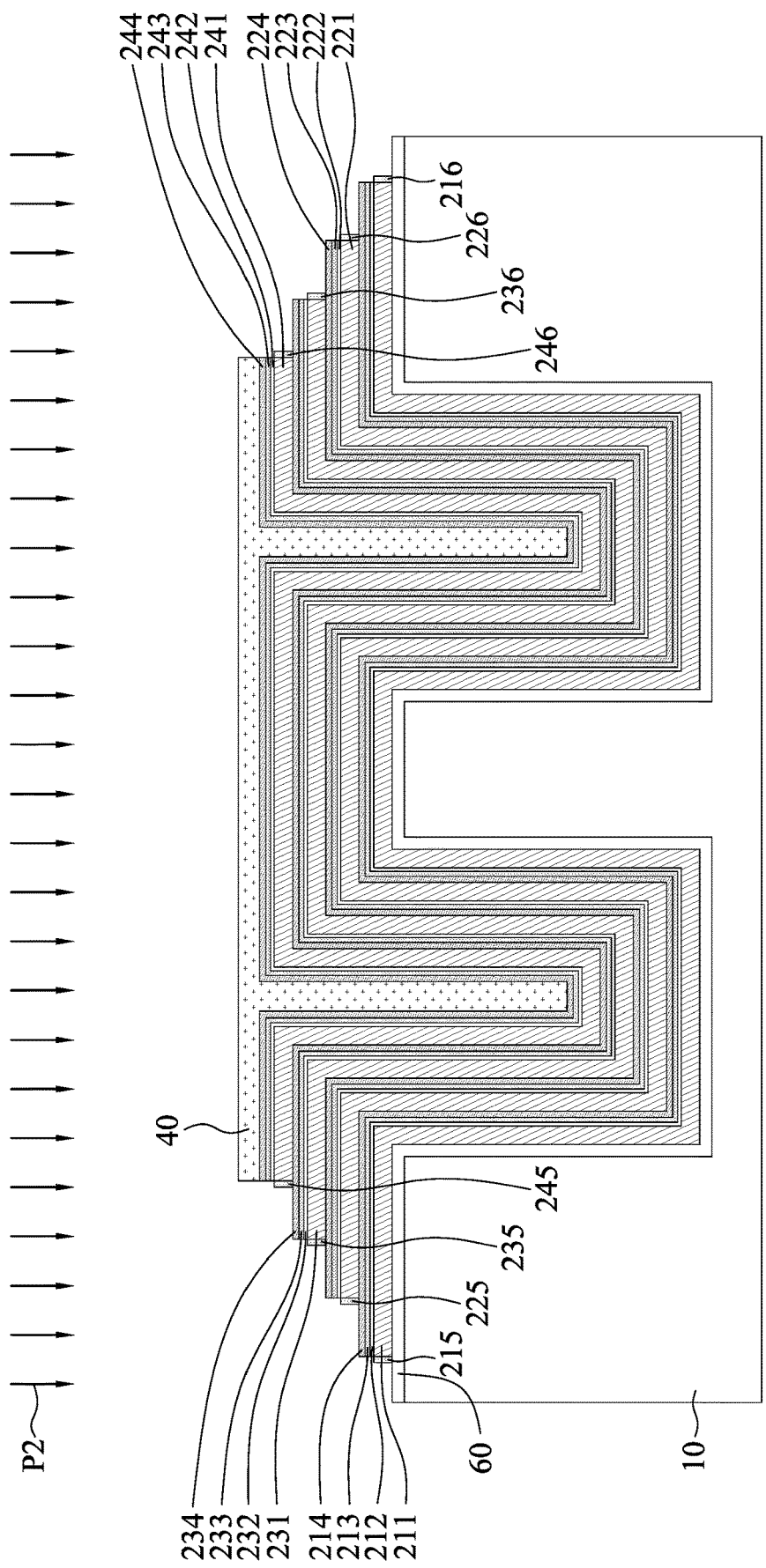

Referring to FIG. 2I, a surface treatment process P2 may be performed on lateral surfaces of the conductive layers 211, 221, 231 and 241. In some embodiments, the surface treatment process P2 is after performing the patterning process (e.g., the etching process). In some embodiments, performing the surface treatment process P2 removes residues from the etching process on the lateral surfaces of the conductive layers 211, 221, 231 and 241. In some embodiments, the residues from the precursor (e.g., $TiCl_4$) may be oxidized by the surface treatment process P2, and defects which could have been formed from the residues (e.g., $TiCl_4$ residues) can be removed. In some embodiments, the surface treatment process P2 may be performed to form dielectric layers 215, 216, 225, 226, 235, 236, 245 and 246 on the lateral surfaces of the conductive layers 211, 221, 231 and 241.

In some embodiments, the surface treatment process P2 may be a surface oxidation process, and the as-formed dielectric layers 215, 216, 225, 226, 235, 236, 245 and 246 may be oxide layers. In some embodiments, the conductive layers 211, 221, 231 and 241 include one or more metal elements, and the dielectric layers 215, 216, 225, 226, 235, 236, 245 and 246 include one or more oxides of the one or more metal elements. In some embodiments, the dielectric layers (or the oxide layers) 215, 216, 225, 226, 235, 236, 245 and 246 are formed from oxidizing the metal element(s) of the conductive layers 211, 221, 231 and 241. For example, the conductive layers 211, 221, 231 and 241 include titanium nitride (TiN), and the dielectric layers 215, 216, 225, 226, 235, 236, 245 and 246 include titanium oxide ($TiO_x$).

In some embodiments, the surface treatment process P2 includes applying an oxygen-containing gas on the lateral surfaces of the conductive layers 211, 221, 231 and 241 and performing a thermal process on the lateral surfaces of the conductive layers 211, 221, 231 and 241. In some embodiments, the thermal process is performed under a temperature from about 200° C. to about 400° C., or from about 250° C. to about 350° C. The temperature range of the thermal process of the surface treatment process P2 is critical in accordance with some embodiments of the present disclosure. When the temperature exceeds 400° C., the risk of undesired crystallization of the high-k material may increase; when the temperature is lower than 200° C., is may be insufficient to produce the desired dielectric sidewalls. In some embodiments, the thermal process is performed for about 3 minutes to about 30 minutes, about 5 minutes to about 20 minutes, or about 10 minutes to about 15 minutes. In some embodiments, the oxygen-containing gas may include oxygen ($O_2$), nitrous oxide ($N_2O$), ozone ($O_3$), or a combination thereof.

Figure 2J:
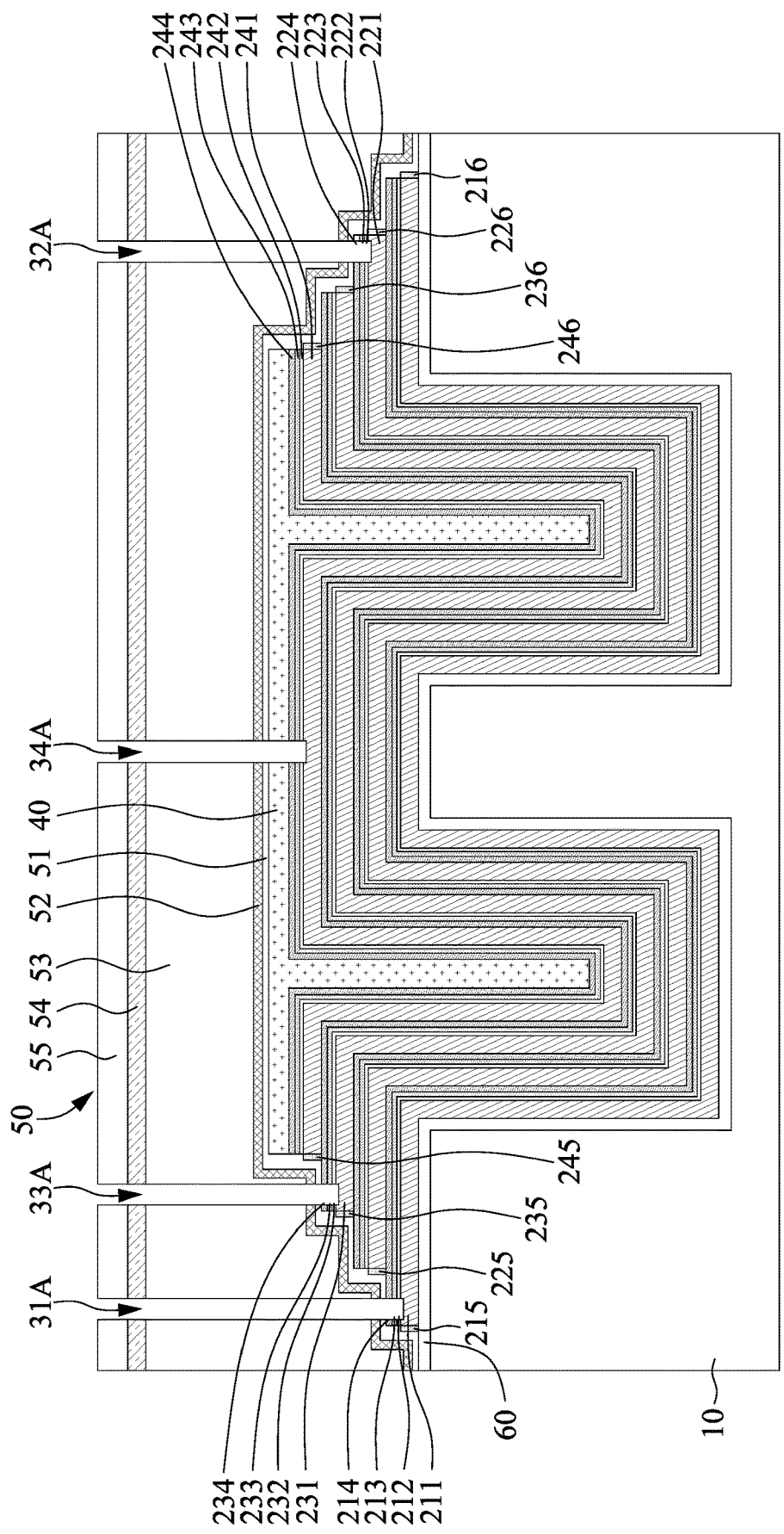

Referring to FIG. 2J, a dielectric structure 50 may be formed to cover the conductive layers 211, 221, 231 and 241 and the dielectric layers 212, 213, 214, 215, 216, 222, 223, 224, 225, 226, 232, 233, 234, 235, 236, 242, 243, 244, 245 and 246, and an etching process may be performed to remove portions of the dielectric layer 212, 213, 214, 222, 223, 224, 232, 233, 234, 242, 243 and 244 to form through holes 31A, 32A, 33A and 34A exposing portions of the conductive layers 211, 221, 231 and 241.

Next, referring to FIG. 1A, contact structures 31, 32, 33 and 34 may be formed within the through holes 31A, 32A, 33A and 34A. In some embodiments, each of the contact structures 31, 32, 33 and 34 contacts a corresponding one of the conductive layers 211, 221, 231 and 241. As such, the semiconductor structure 1 is formed.

In some other embodiments, the surface treatment process P1 is omitted, and the dielectric layer 214A is formed directly on the conductive layer 211A. In the embodiments, the dielectric layer 214A includes an oxide material which reacts with the conductive layer 211A, and thus an interfacial dielectric layer 212A may be formed between the conductive layer 211A and the dielectric layer 214A. In the embodiments, since the dielectric layer (or the protective dielectric layer) 213A is omitted, the dielectric thickness on the conductive layer 211A is relatively thin.

According to some embodiments of the present disclosure, the protective dielectric layer together with the interfacial dielectric layer can provide an increased dielectric thickness on the conductive layer, and thus it can provide an enlarged contact etching depth window. Therefore, when an etching process is performed over the conductive layer to form a through hole in which a contact structure is formed subsequently, the enlarged contact etching depth window of the increased dielectric thickness prevents the etching process (e.g., an over-etching process) from penetrating through the conductive layer to another conductive layer underneath, and thus undesired short circuit between adjacent conductive layers can be prevented.

In addition, according to some embodiments of the present disclosure, the dielectric sidewalls on lateral surfaces of the electrode layers may be formed by oxidation reaction on the lateral surfaces of the electrode layers during manufacturing. For example, contaminations or residues from the previous processes (e.g., etching processes) or from the remained precursors may be consumed and removed by the oxidation reaction and form the dielectric sidewalls. Therefore, contaminations can be mitigated or prevented, and the yield can be improved.

Figure 3:
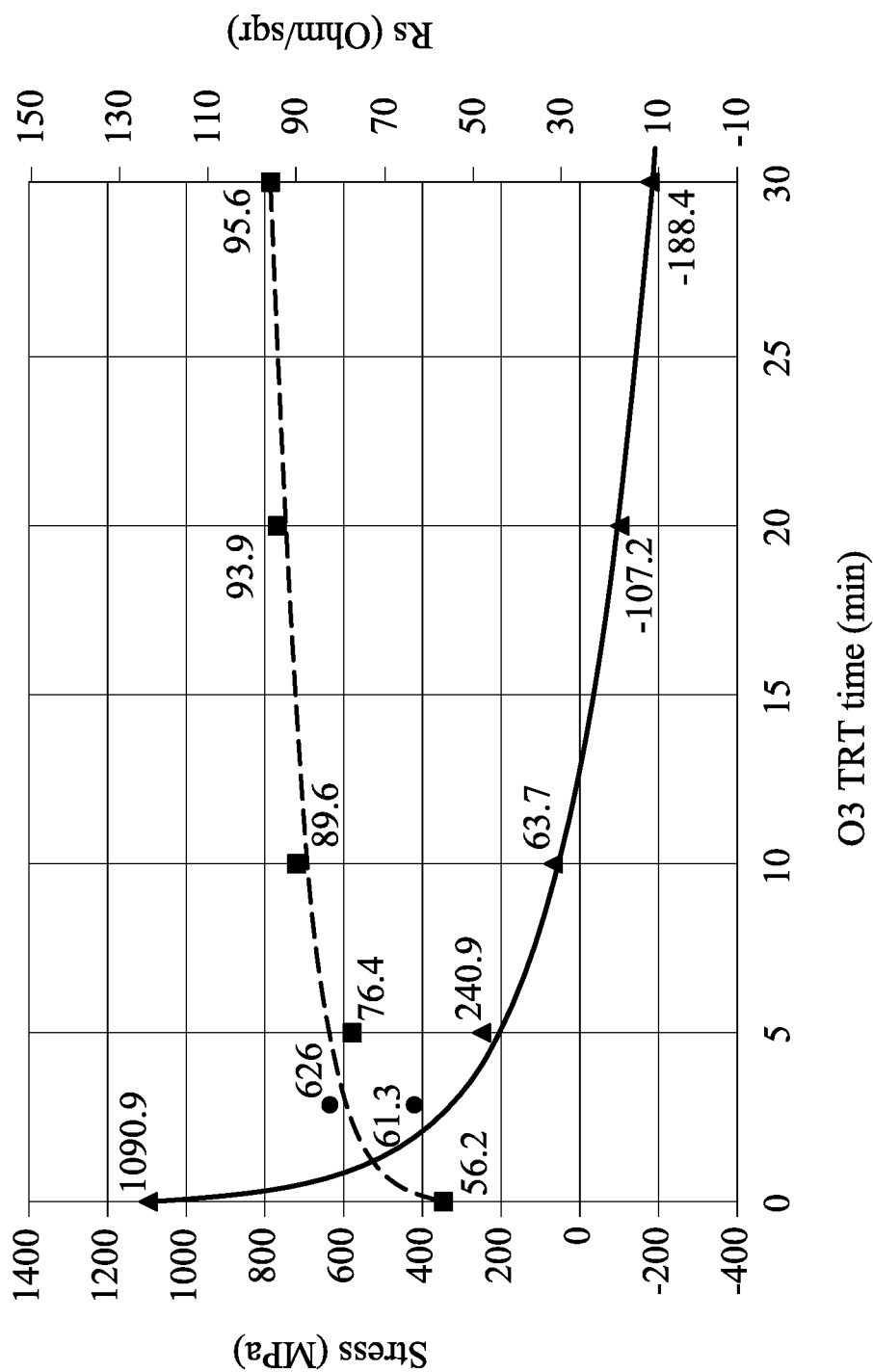
FIG. 3 shows relationships between surface oxidation treatment time and stress and resistance of conductive layers of semiconductor structures according to aspects of the present disclosure in one or more embodiments.

Presented below are experimental results of conductive layers (or electrode layers) of exemplary semiconductor structures formed by methods of various embodiments. Tables 1-2 show conditions of surface oxidation treatments and the properties of the as-formed conductive layers (or electrode layers). FIG. 3 shows relationships between surface oxidation treatment time and stress and resistance of conductive layers of semiconductor structures according to aspects of the present disclosure in one or more embodiments. In table 1, "TIN baseline" refers to a conductive layer formed of TiN with performing any surface treatment process thereon, "TiN+HK" refers to a conductive layer with a high-k material (e.g., a capacitor dielectric layer) formed thereon without performing any surface treatment process thereon prior to forming the high-k material. In addition, in table 1, "$N_2O$" refers to an $N_2O$ treatment with a gas flow rate of 12 slm and under 400° C. for 3 minutes. In table 2, "$O_3$" refers to $O_3$ treatments with a gas flow rate of 6.5 slm and under 350° C. for 5 to 30 minutes.

TABLE 1

|  | TiN baseline | TiN + HK | N₂O |
|---|---|---|---|
| Stress (MPa) | 1090 | N/A | 626 |
| Resistance (Rs_Mean) (Ohm/sqr) | 56.2 | N/A | 61.3 |
| Thickness of interfacial dielectric oxide (Å) | 0 | 14 | 14 |
| Thickness of protective dielectric oxide (Å) | 0 | 0 | 39 |
| Thickness of capacitor dielectric oxide (Å) | 0 | 67 | 66 |

TABLE 2

|  | TiN baseline | TiN + HK | O₃/10 minutes | O₃/30 minutes |
|---|---|---|---|---|
| Stress (MPa) | 1090 | N/A | 63.7 | −188.4 |
| Resistance (Rs_Mean) (Ohm/sqr) | 56.2 | N/A | 89.6 | 95.6 |
| Sum of thicknesses of interfacial dielectric oxide and protective dielectric oxide (Å) | 0 | 14 | 35 | 55 |
| Thickness of capacitor dielectric oxide (Å) | 0 | 67 | N/A | N/A |

From the results in tables 1-2 and FIG. 3, the stress of the conductive layer may be tuned within a relatively range, for example, from having a tensile stress to a compressive stress, while the resistance remains relatively low. In addition, the dielectric thickness over the conductive layer is increased after the surface treatment process, and various oxygen sources may be applied in the surface treatment process.

According to some embodiments of the present disclosure, the stress incurred by the conductive layer can be tuned by adjusting the conditions of the surface treatment process, and thus the warpage of the semiconductor structure can be mitigated or prevented. For example, when the capacitor structure 20 is an MIM capacitor including a plurality of electrode layers each having a relatively large area and stacked on each other, the stress incurred by the electrode layers may result in high warpage, and the buffer oxide layers formed between the electrode layers and the capacitor dielectric layers can modulate the stress and thus reduce the warpage.

Some embodiments of the present disclosure provide a semiconductor structure. The semiconductor structure includes a capacitor structure and a contact structure. The capacitor structure includes an electrode layer, a protective dielectric layer, and a capacitor dielectric layer. The protective dielectric layer covers a top surface of the electrode layer. The capacitor dielectric layer is on the protective oxide layer. The contact structure penetrates the protective oxide layer and electrically connects to the electrode layer.

Some embodiments of the present disclosure provide a semiconductor structure. The semiconductor structure includes a semiconductor substrate, a first conductive layer, a first dielectric layer, and a first buffer oxide layer. The first conductive layer is on the semiconductor substrate. The first dielectric layer is over the first conductive layer. The first buffer oxide layer is between the first electrode layer and the first dielectric layer. A ratio of a thickness of the first buffer oxide layer to a thickness of the first dielectric layer is greater than about 0.25.

Some embodiments of the present disclosure provide a method for forming a semiconductor structure. The method includes following operations: forming a first conductive layer over a semiconductor substrate; performing a first surface oxidation process on a top surface of the first conductive layer to form a protective layer on the first conductive layer; forming a dielectric layer on the protective layer; forming a second conductive layer on the dielectric layer, and performing an etching process to remove a portion of the dielectric layer and a portion of the protective layer to form a through hole exposing a portion of the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a capacitor structure, comprising:
        a first electrode layer;
        a second electrode layer over the first electrode layer;
        a protective dielectric layer covering and contacting a top surface of the first electrode layer;
        a capacitor dielectric layer on the protective dielectric layer; and
        a protective dielectric sidewall covering a lateral surface of the second electrode layer, wherein the first electrode layer, the second electrode layer, the protective dielectric sidewall, and the protective dielectric layer comprise a same metal element;
    a contact structure penetrating the protective dielectric layer and electrically connecting to the second electrode layer.

2. The semiconductor structure of claim 1, wherein the protective dielectric layer is between the first electrode layer and the capacitor dielectric layer, and a ratio of a thickness of the protective dielectric layer to a thickness of the capacitor dielectric layer is greater than about 0.25.

3. The semiconductor structure of claim 2, wherein the same metal element comprises titanium.

4. The semiconductor structure of claim 1, further comprising a dielectric layer between the first electrode layer and the second electrode layer.

5. The semiconductor structure of claim 4, further comprising a dielectric structure covering the capacitor structure and contacting the protective dielectric sidewall.

6. The semiconductor structure of claim 5, wherein the second electrode layer is spaced apart from the dielectric structure by the protective dielectric sidewall.

7. The semiconductor structure of claim 6, wherein the contact structure contacts the dielectric structure and the protective dielectric layer.

8. A semiconductor structure, comprising:
    a semiconductor substrate;
    a first conductive layer on the semiconductor substrate;
    a second conductive layer below the first conductive layer;
    a first dielectric layer over the first conductive layer;
    a second dielectric layer between the second conductive layer and the first conductive layer;
    a first buffer oxide sidewall over the second dielectric layer and covering a lateral surface of the first conductive layer; and a first buffer oxide layer covering and contacting a top surface of the second conductive layer, wherein the second conductive layer, the first conductive layer, the first buffer oxide sidewall, and the first buffer oxide layer comprise a same metal element.

9. The semiconductor structure of claim 8, wherein the first buffer oxide layer is between the second conductive layer and the second dielectric layer, and a ratio of a thickness of the first buffer oxide layer to a thickness of the second dielectric layer is greater than about 0.25.

10. The semiconductor structure of claim 9, further comprising a first contact structure penetrating the first dielectric layer to contact the first conductive layer.

11. The semiconductor structure of claim 8, further comprising a second buffer oxide sidewall on a lateral surface of the second conductive layer.

12. The semiconductor structure of claim 8, further comprising:
a second buffer oxide layer between the second conductive layer and the second dielectric layer.

13. The semiconductor structure of claim 12, further comprising a second contact structure penetrating the second dielectric layer and the second buffer oxide layer to contact the second conductive layer.

14. The semiconductor structure of claim 12, wherein the first buffer oxide sidewall is on a top surface of the second dielectric layer.

15. A semiconductor structure, comprising:
a capacitor structure, comprising:
a first electrode layer;
a second electrode layer over the first electrode layer;
a first dielectric layer between the first electrode layer and the second electrode layer; and
a first buffer oxide sidewall over the first dielectric layer and covering a lateral surface of the second electrode layer; and
a first contact structure penetrating the first dielectric layer and electrically connected to the first electrode layer,
wherein the capacitor structure further comprises a first buffer oxide layer covering and contacting a top surface of the first electrode layer, and
wherein the first electrode layer, the second electrode layer, the first buffer oxide sidewall, and the first buffer oxide layer comprise a same metal element.

16. The semiconductor structure of claim 15, wherein the first buffer oxide sidewall is spaced apart from the first buffer oxide layer by the first dielectric layer.

17. The semiconductor structure of claim 15, wherein the capacitor structure further comprises a second dielectric layer over the first buffer oxide layer, and the semiconductor structure further comprises a second contact structure penetrating the second dielectric layer and the first buffer oxide layer and electrically connected to the second electrode layer.

18. The semiconductor structure of claim 15, wherein the first buffer oxide sidewall contacts the first dielectric layer and the lateral surface of the second electrode layer.

19. The semiconductor structure of claim 15, further comprising a dielectric structure covering the capacitor structure and contacting the first buffer oxide sidewall and the first buffer oxide layer.

20. The semiconductor structure of claim 19, wherein the first buffer oxide sidewall is spaced apart from the first buffer oxide layer by a portion of the dielectric structure.

* * * * *